(12) United States Patent
Kumar et al.

(10) Patent No.: US 10,714,195 B2
(45) Date of Patent: Jul. 14, 2020

(54) READ DISTURB DETECTION AND RECOVERY WITH ADAPTIVE THRESHOLDING FOR 3-D NAND STORAGE

(71) Applicant: SK Hynix Inc., Gyeonggi-do (KR)

(72) Inventors: Naveen Kumar, San Jose, CA (US); Aman Bhatia, San Jose, CA (US); Fan Zhang, San Jose, CA (US); Chenrong Xiong, San Jose, CA (US); Yu Cai, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 174 days.

(21) Appl. No.: 15/835,246

(22) Filed: Dec. 7, 2017

(65) Prior Publication Data
US 2019/0066809 A1 Feb. 28, 2019

Related U.S. Application Data

(60) Provisional application No. 62/553,013, filed on Aug. 31, 2017.

(51) Int. Cl.
*G11C 16/34* (2006.01)
*G11C 29/52* (2006.01)
(Continued)

(52) U.S. Cl.
CPC ...... *G11C 16/3431* (2013.01); *G06F 11/1068* (2013.01); *G06F 11/1072* (2013.01);
(Continued)

(58) Field of Classification Search
CPC ..... G11C 16/3431; G11C 29/38; G11C 29/42; G11C 29/44; G11C 29/50004;
(Continued)

(56) References Cited

U.S. PATENT DOCUMENTS 4,293,927 A * 10/1981 Hoshii ................. G06F 1/3228
327/143
7,234,086 B1 * 6/2007 de Koos .................. H04J 3/14
714/704

(Continued)

OTHER PUBLICATIONS

Cai et al., Read Disturb Erros in MLC NAND Flash Memory: Characterization, Mitigation and Recoever, IEEE, Conference paper, Pertinent pp. 438-449. (Year: 2015)*

*Primary Examiner* — April Y Blair
*Assistant Examiner* — Dipakkumar B Gandhi
(74) *Attorney, Agent, or Firm* — Kilpatrick Townsend & Stockton LLP

(57) ABSTRACT

A system includes memory cells arranged in blocks and a memory controller. The memory controller receives a read command to read a first block. The first block can be associated with a first read count and a first read threshold. The first read count is incremented when the first block is read, and when the first read count reaches the read threshold, a read reclaim test is performed. The first read count is set to zero after a power off or a read reclaim operation. When the first read count is zero, an adaptive read threshold is selected based on the number of bit errors. Further, in a read reclaim test, the number of bit errors is tested against an adaptive error threshold to determine whether a garbage collection operation is performed.

20 Claims, 11 Drawing Sheets

(51) Int. Cl.

| | |
|---|---|
| *G06F 11/10* | (2006.01) |
| *G11C 16/26* | (2006.01) |
| *G11C 29/42* | (2006.01) |
| *G11C 11/56* | (2006.01) |
| *G11C 29/50* | (2006.01) |
| *G11C 29/38* | (2006.01) |
| *G11C 29/12* | (2006.01) |
| *G11C 29/44* | (2006.01) |
| *G11C 16/24* | (2006.01) |

(52) U.S. Cl.
CPC .......... *G11C 11/5642* (2013.01); *G11C 16/26* (2013.01); *G11C 16/3418* (2013.01); *G11C 29/12005* (2013.01); *G11C 29/38* (2013.01); *G11C 29/42* (2013.01); *G11C 29/44* (2013.01); *G11C 29/50004* (2013.01); *G11C 29/52* (2013.01); *G11C 2029/1202* (2013.01); *G11C 2029/1204* (2013.01); *G11C 2211/5644* (2013.01)

(58) Field of Classification Search
CPC ............ G11C 29/52; G11C 2029/1202; G11C 2029/1204; G11C 16/26; G11C 16/3418; G11C 11/5642; G11C 29/12005; G11C 2211/5644; G11C 29/028; G11C 11/1072; G06F 11/1068; G06F 11/1072
See application file for complete search history.

(56) References Cited

U.S. PATENT DOCUMENTS

| | | | |
|---|---|---|---|
| 9,069,659 B1 | 6/2015 | Sabbag et al. | |
| 9,361,991 B1* | 6/2016 | Ng | G11C 11/5628 |
| 9,570,198 B2 | 2/2017 | Bellorado et al. | |
| 2006/0041804 A1* | 2/2006 | Do | G11C 29/12 714/724 |
| 2011/0179321 A1* | 7/2011 | Takeuchi | G11C 29/50 714/718 |
| 2012/0311381 A1* | 12/2012 | Porterfield | G06F 11/1004 714/6.22 |
| 2014/0013166 A1* | 1/2014 | Subrannanian | G06F 1/3206 714/47.2 |
| 2015/0262557 A1* | 9/2015 | Fritz | G09G 5/395 345/547 |
| 2015/0268871 A1* | 9/2015 | Shu | G06F 3/0616 711/103 |
| 2015/0339188 A1* | 11/2015 | Hu | G06F 11/1072 714/704 |
| 2016/0118132 A1* | 4/2016 | Prins | G11C 16/26 714/704 |
| 2016/0342458 A1* | 11/2016 | Cai | G11C 16/26 |
| 2016/0350164 A1* | 12/2016 | Cunningham | G11C 16/3454 |
| 2017/0206979 A1 | 7/2017 | Cohen et al. | |
| 2017/0286288 A1* | 10/2017 | Higgins | G06F 12/0246 |
| 2018/0159560 A1* | 6/2018 | Sharon | G06F 3/0619 |

* cited by examiner

700

| Drive | $N_b$ | Counter Storage in memory (KB) |
|---|---|---|
| 128GB | 2,4,8,16,32 | 32, 16, 8, 4, 2 |
| 64GB | 2,4,8,16 | 16, 8, 4, 2 |
| 32GB | 2,4,8 | 8, 4, 2 |
| 16GB | 2,4 | 4, 2 |
| 8GB | 2 | 2 |

FIG. 7

READ DISTURB DETECTION AND RECOVERY WITH ADAPTIVE THRESHOLDING FOR 3-D NAND STORAGE

CROSS-REFERENCE TO RELATED APPLICATION

The present application claims priority to Provisional Application No. 62/553,013 entitled "READ DISTURB ALGORITHM WITH ADAPTIVE THRESHOLDING FOR 3D NAND STORAGE," filed Aug. 31, 2017, which is assigned to the assignee hereof and expressly incorporated by reference herein in its entirety.

BACKGROUND OF THE INVENTION

The present invention relates generally to methods and apparatus for storage devices, and specifically to improving performance of non-volatile memory devices. More particularly, embodiments of the present invention provide improved method of non-volatile memory devices.

Solid-state memory is ubiquitously used in a variety of electronic systems including, for example, consumer electronic devices (e.g., cellular phones, cameras, computers, etc.) and in enterprise computing systems (e.g., hard drives, random access memory (RAM), etc.). Solid-state memory has gained popularity over mechanical or other memory storage techniques due to latency, throughput, shock resistance, packaging, and other considerations. Among these non-volatile memory devices, NAND flash memory devices are popular due to low manufacturing cost for a high degree of integration.

Data stored in solid-state memory devices may degrade over time. For example, read disturb noise is a type of noise that is introduced during the process of reading solid state storage (e.g., NAND Flash). During a read, the control gates of all cells in the selected block (other than the cells being read) are biased to a voltage which exceeds the maximum voltage that any cell in the block may be written to. In doing so, these cells are placed into the pass state, in which they act as short-circuits, thus isolating only the cells which are being read. An undesirable byproduct of this biasing, however, is the application of additional electrons to the floating-gates of these cells. This unintentional and additional charges can change the cell voltage and is referred to as read disturb. Improved read disturb detection and recovery techniques would be desirable.

BRIEF SUMMARY OF THE INVENTION

In serving data traffic from the host, controller experiences a scenario where a single page is read multiple times that causes read disturb to the entire block. Before drive qualification, a single page read (SPRD) test is extensively performed on a drive. This motivates the read disturb algorithm implementation in the firmware that tackles the SPRD and read disturb happened on multiple pages in a superblock well enough for viable use of the drive. Ideally there can be a counter for each page in the whole drive that can keep the count for the number of read operations that have taken place on each page. Whenever this counter exceeds a certain threshold, the superblock containing that page can be garbage collected. However, there is a significant storage overhead for these counters for the entire drive that makes this algorithm unacceptable. Therefore, it is desirable to reduce the overhead of testing every page.

A system includes memory cells arranged in blocks and a memory controller. The memory controller receives a read command to read a first block. The first block can be associated with a first read count and a first read threshold. The first read count is incremented when the first block is read, and when the first read count reaches the read threshold, a read reclaim test is performed. The first read count is set to zero after a power off or a read reclaim operation. When the first read count is zero, an adaptive read threshold is selected based on the number of bit errors. Further, in a read reclaim test, the number of bit errors is tested against an adaptive error threshold to determine whether a garbage collection operation is performed.

According to some embodiments of the present invention, a system, for example, a storage system, can include a plurality of memory cells arranged in blocks and a memory controller coupled to the plurality of memory cells for controlling data write and read in the plurality of memory cells. The memory controller can be configured to receive a read command to read a first block. The first block can be associated with a first read count and a first read threshold. The first read count represents a number of read operations of the first block that has been performed, and the first read threshold represents a number of read operations that triggers a read test operation. The memory controller can be configured to determine whether the first read count is equal to zero, and in response to determining that the first read count is equal to zero, select a second read threshold as a target read threshold based on bit errors associated with the first block. On the other hand, if the first read count is not equal to zero, the first read threshold is selected as the target read threshold. The memory controller can also be configured to perform a read operation and increment the first read count. Further, the memory controller can be configured to determine whether the first read count is equal to a multiple of the target read threshold. In response to determining that the first read count exceeds the target read threshold, the memory controller can be configured to perform a read reclaim operation based on comparing the first read count with the target read threshold.

In some embodiments of the above system, selecting a second read threshold can include performing a test read to determine a number of bit errors associated with a plurality of blocks associated with the first block, and selecting the second read threshold based on the number of bit errors.

In some embodiments of the above system, the memory controller can be configured to perform a test read operation to determine a number of bit errors associated with a plurality of blocks associated with the first block, and determine whether the number of bit errors exceeds an error threshold, the error threshold being selected based on the number of bit errors. In response to determining that the number of bit errors exceeds the error threshold, the memory controller can be configured to perform a read reclaim operation in the plurality of blocks associated with the first block, and clear the first read count associated with the first block.

In some embodiments of the above system, the plurality of blocks associated with the first block, which can also be referred to as an expanded block.

In some embodiments the expanded block can also include, in a 3-D NAND storage system, pages associated with a word line at a higher level than the first block and pages associated with a word line at a lower level than the first block.

In some embodiments of the above system, the error threshold can be a percentage of an error correction capability of the system, the percentage being selected based on the number of bit errors.

In some embodiments of the above system, the read reclaim operation comprises copying valid values from the plurality of the memory cells to another plurality of memory cells.

In some embodiments of the above system, the error threshold is a percentage of an error correction capability of the device, the percentage being selected based on the target read threshold.

In some embodiments of the above system, the first read count is set to 0 after a power off or after a read reclaim operation.

In some embodiments, the memory controller can be configured to select the second read threshold from a lookup table based on the number of bit errors.

In some embodiments, the lookup table can include decreasing second read thresholds for increasing number of bit errors.

In some embodiments of the above system, the first read count is incremented by 1 for a single plane read, and incremented by 2 for a dual plane read.

According to some embodiments of the present invention, a non-volatile data storage device can include a plurality of memory cells arranged in blocks and a memory controller coupled to the plurality of memory cells for controlling data write and read in the plurality of memory cells. The memory controller can be configured to receive a read command to read a first block. The first block can be associated with a first read count and a first read threshold. The first read count represents a number of read operations of the first block that has been performed, and the first read threshold represents a number of read operations that triggers a read test operation. The memory controller can be configured to set the first read threshold as a target read threshold and determine whether the first read count is equal to zero. In response to determining that the first read count is equal to zero, a second read threshold can be selected as the target read threshold. The memory controller can be configured to select the second read threshold by performing a test read to determine a number of bit errors associated with a plurality of blocks associated with the first block, selecting the second read threshold based on the number of bit errors, and setting the second read threshold as the target read threshold. The memory controller can also be configured to perform a read operation of the first block and increment the first read count. The memory controller can be configured to determine whether the first read count exceeds the target read threshold. In response to determining that the first read count is equal to a multiple of the target read threshold, the memory controller can be configured to perform a test read operation to determine a number of bit errors associated with the plurality of blocks associated with the first block. The memory controller can also be configured to determine whether the number of bit errors exceeds an error threshold, which can be selected based on the number of bit errors. In response to determining that the number of bit errors exceeds the error threshold, the memory controller can be configured to perform a read reclaim operation in the plurality of blocks associated with the first block, and clear the first read count associated with the first block.

According to some embodiments of the present invention, a method of controlling a storage system is provided. The storage system can include a plurality of memory cells arranged in blocks and a memory controller coupled to the plurality of memory cells for controlling data write and read in the plurality of memory cells. The method can include receiving a read command to read a first block, the first block being associated with a first read count and a first read threshold. The first read count represents a number of read operations of the first block that has been performed, and the first read threshold represents a number of read operations that triggers a read test operation. The method can include determining whether the first read count is equal to zero, and in response to determining that the first read count is equal to zero, selecting a second read threshold as a target read threshold based on bit errors associated with the first block. The method can also include, in response to determining that the first read count is not equal to zero, selecting the first read threshold as the target read threshold. The method can also include performing a read operation and incrementing the first read count. Further, the method can include determining whether the first read count is equal to a multiple of the target read threshold, and in response to determining that the first read count is equal to a multiple of the target read threshold, performing a read reclaim operation based on comparing the first read count with the target read threshold.

In some embodiments of the above method, selecting a second read threshold can include performing a test read to determine a number of bit errors associated with a plurality of blocks associated with the first block, and selecting the second read threshold based on the number of bit errors.

In some embodiments, the method can also include performing a test read operation to determine a number of bit errors associated with a plurality of blocks associated with the first block, determining whether the number of bit errors exceeds an error threshold, which is selected based on the number of bit errors. The method also includes, in response to determining that the number of bit errors exceeds the error threshold, performing a read reclaim operation in the plurality of blocks associated with the first block, and clearing the first read count associated with the first block.

In some embodiments, the error threshold is a percentage of an error correction capability of the storage system, the percentage being selected based on the number of bit errors.

wherein the error threshold is a percentage of an error correction capability of the device, the percentage being selected based on the target read threshold.

In some embodiments, the read reclaim operation comprises copying valid values from the plurality of the memory cells to another plurality of memory cells.

More understanding of the nature and advantages of various embodiments may be realized by reference to the following figures.

BRIEF DESCRIPTION OF THE DRAWINGS

FIG. 7 is a table listing the counter storage required for different values of number of blocks per counter according to some embodiments of the present invention;

DETAILED DESCRIPTION OF THE INVENTION

Figure 1:
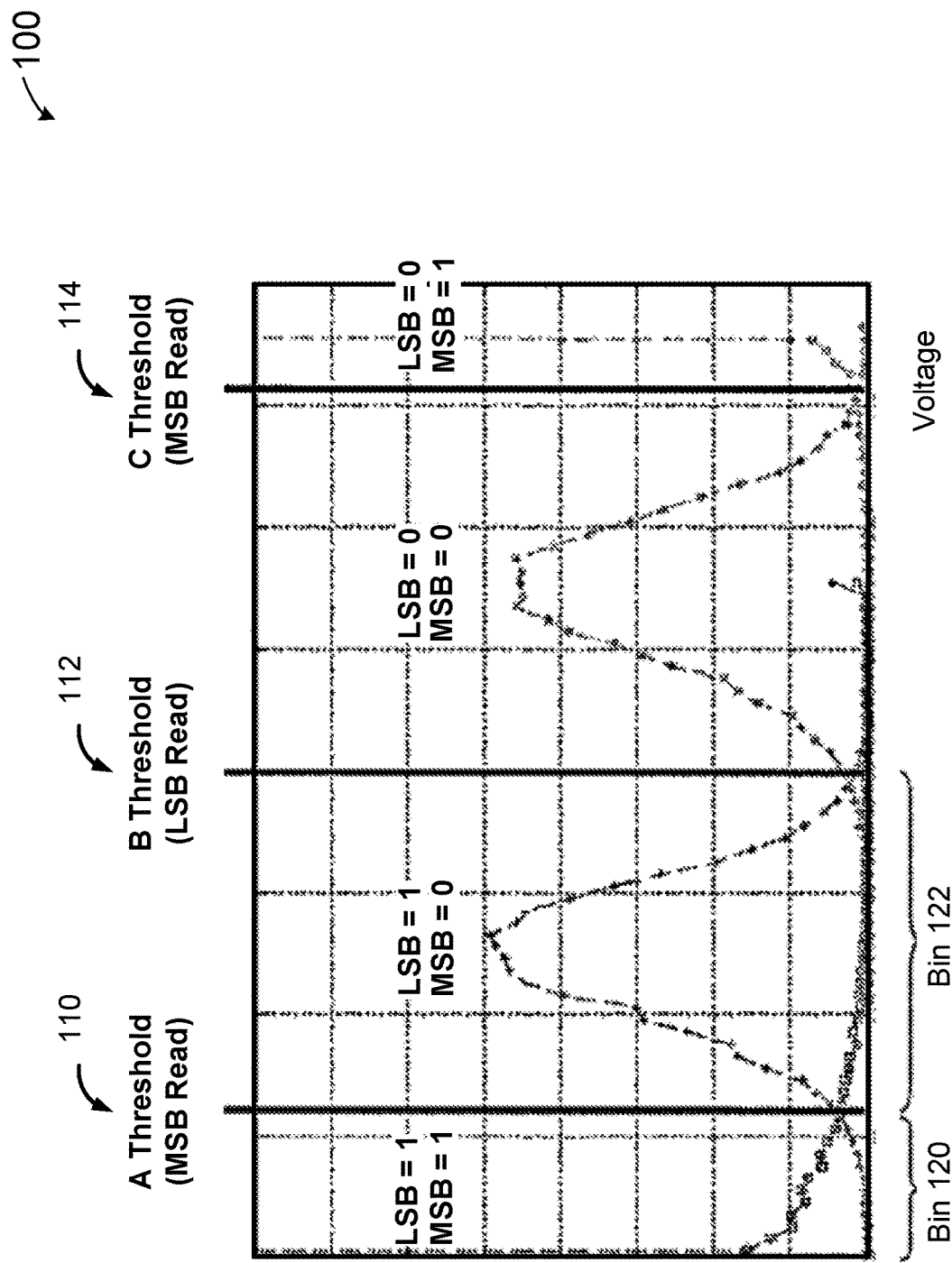
FIG. 1 is a diagram illustrating an example distribution of voltages exhibiting read disturb noise in a group of cells in a 2-bit multi-level cell (MLC) system.

FIG. 1 is a diagram illustrating an example distribution of voltages exhibiting read disturb noise in a group of cells in a 2-bit multi-level cell (MLC) system. FIG. 1 shows each cell is configured to store 2 bits: a most significant bit (MSB) and a least significant bit (LSB). When a cell is read, 3 thresholds are used: A threshold 110, B threshold 112, and C threshold 114. The A and C thresholds are used to read the MSB. If the voltage stored by the cell is less than A threshold 110 or is greater than C threshold 114, then the MSB is read as a 1. If the voltage is between A threshold 110 and C threshold 114, then the MSB is read as a 0. The B threshold is used to read the LSB. If the voltage stored by the cell is less than B threshold 112, then the LSB is read as a 1. If the voltage stored by the cell is greater than B threshold 112, then the LSB is read as a 0. In some other embodiments, the LSB and MSB may be swapped and/or some other bit mapping may be used.

Read disturb noise tends to affect lower voltages, for example those voltages stored by the cells in bin 120 in FIG. 1. Consider a cell which has a voltage just less than A threshold 110 before read disturb noise is added to that cell. With read disturb noise, the voltage of the cell can be pushed over the A threshold such that that cell would now be in bin 122 and not bin 120. In comparing the LSB and MSB values of bins 120 and bin 122, the LSB values are the same. However, the MSB value is different for cells in bin 120 compared to bin 122, and so the MSB will be more useful in detecting read disturb noise.

Although some embodiments described herein show 2-bit, MLC examples, the techniques described herein are applicable to solid state systems which store any number of bits. For example, the techniques described herein work with 1-bit single-level cell (SLC) systems as well as 3-bit tri-level cell (TLC) systems, and so on.

Figure 2:
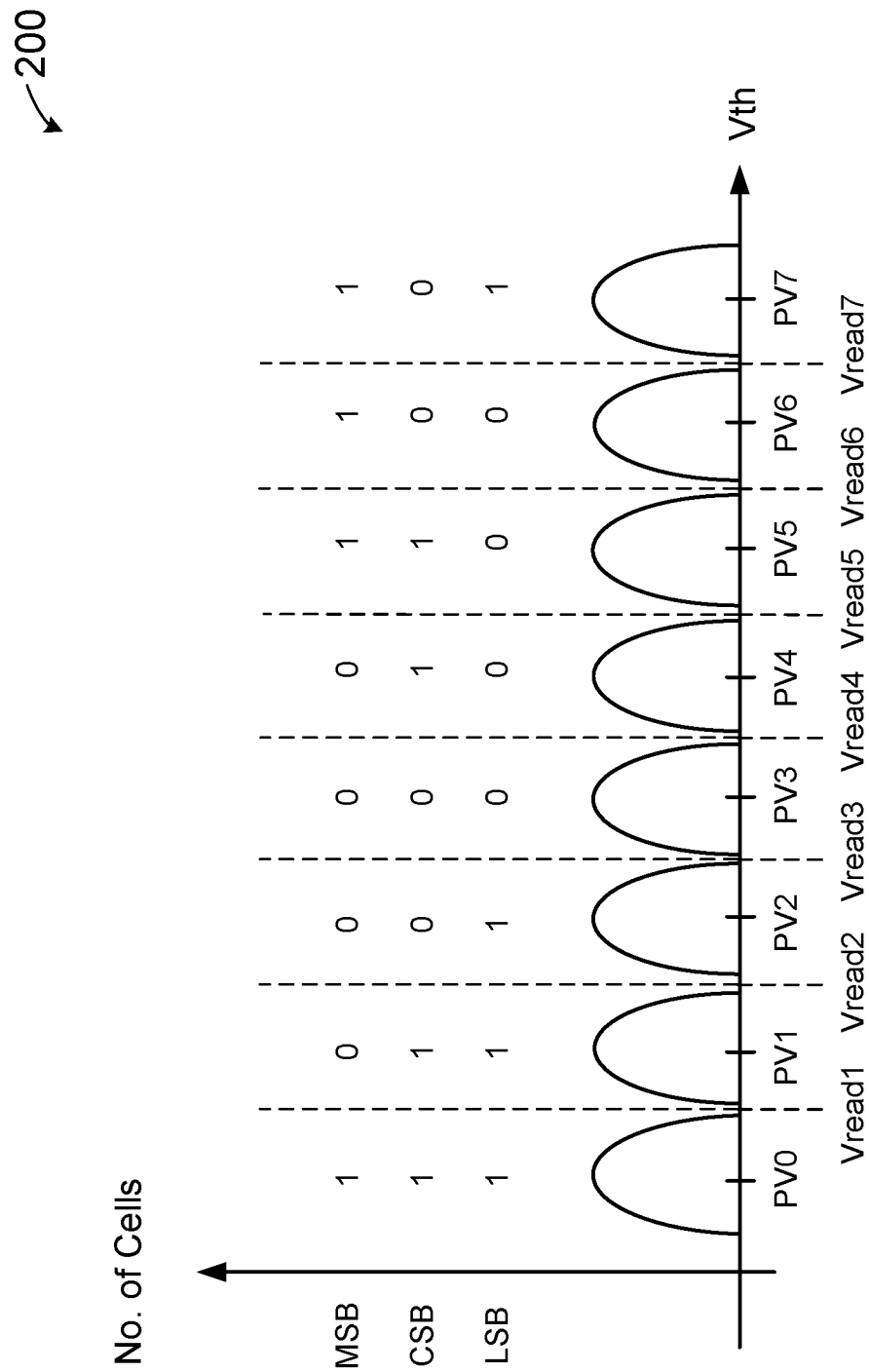
FIG. 2 is a simplified diagram illustrating a distribution of cell voltages of a memory device having 3-bit three-level cell (TLC) in a flash memory device according to some embodiments of the present invention.

FIG. 2 is a simplified diagram illustrating a distribution of cell voltages of a memory device having 3-bit three-level cell (TLC) in a flash memory device according to some embodiments of the present invention. In FIG. 2, the cell threshold voltages for an erase state "PV0" and seven programmed states "PV1" to "PV7" are shown. The spread in cell threshold voltage is caused by differences in cell characteristics and operation history. In FIG. 2, each cell is configured to store 3-bits: a most significant bit (MSB), a center significant bit (CSB), and a least significant bit (LSB). Also shown in FIG. 2 are seven read thresholds, labeled as "Vread1," "Vread2," . . . , and "Vread7," which are used to determine the data stored in the memory cell. Thresholds Vread1 and Vread5 are used to read the MSB. If the voltage stored by the cell is less than Vread1 or is greater than Vread5, then the MSB is read as a 1. If the voltage is between Vread1 and Vread5, then the MSB is read as a 0. Thresholds Vread3 and Vread7 are used to read the LSB. If the voltage stored by the cell is less than Vread3 or is greater than Vread7, then the LSB is read as a 1. If the voltage is between Vread3 and Vread7, then the LSB is read as a 0. Similarly, thresholds Vread2, Vread4, and Vread6 are used to read the CSB.

In serving data traffic from the host, controller experiences a scenario where a single page is read multiple times that causes read disturb to the entire block. Before drive qualification, a single page read (SPRD) test is extensively performed on a drive. This motivates the read disturb algorithm implementation in the firmware that tackles the SPRD and read disturb that happened on multiple pages in a superblock well enough for viable use of the drive. Ideally there can be a counter for each page in the whole drive that can keep the count for the number of read operations that have taken place on each page. Whenever this counter exceeds a certain threshold, the superblock containing that page can be garbage collected. However, there is a significant storage overhead for these counters for the entire drive that makes this algorithm unacceptable. Therefore, it is desirable to reduce the overhead of testing every page.

Figure 3:
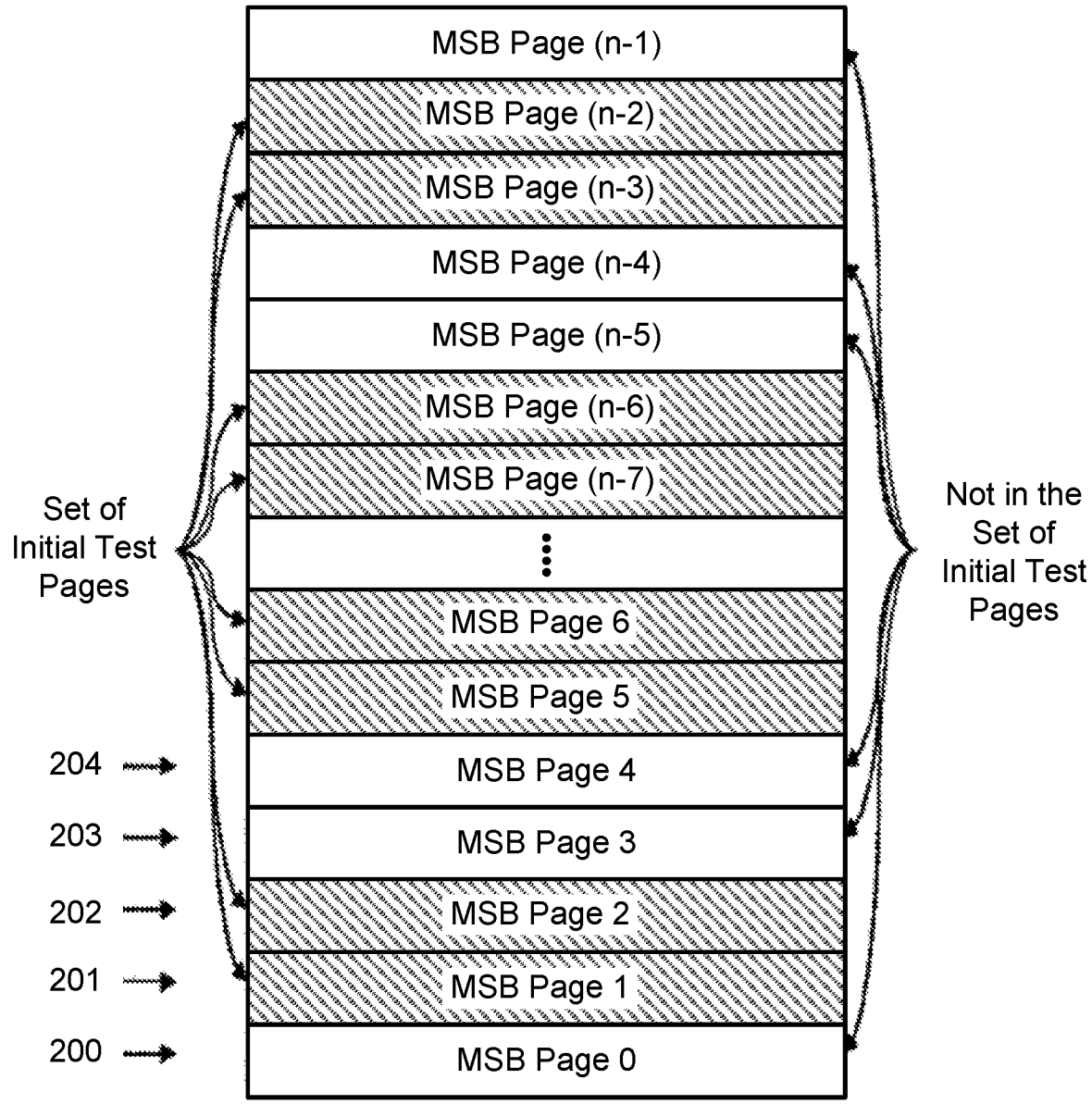
FIG. 3 illustrates an example of initial set of test pages in a block of a 2-bit multi-level cell (MLC) system.

FIG. 3 illustrates an example of an initial set of test pages in a block of a 2-bit multi-level cell (MLC) system. This example shows an all bit-line structure which has a single LSB page and a single MSB page per word line. For the reasons described above, MSB pages are tested in order to detect read disturb. The set of initial test pages is referred to as such because those pages are the ones that are tested at first. In the example shown, the block begins (ends) with a single MSB page which is not in the set of initial test pages (shown in white), followed by 2 MSB pages which are in the set (shown in grey), followed by 2 MSB pages which are not in the set, and so on. If read disturb noise is detected, then a related page (which may not necessarily be in the set of initial test pages) may be tested for read disturb noise. To put it another way, a page that is not in the set of initial test pages (e.g., MSB page 0 (200)) is not excluded from read disturb testing per se, but rather is not tested at least at first.

When a read (e.g., initiated by a host) is performed on a given page, the pages above and below are the most vulnerable to read disturb noise. For example, if MSB page 0 (200) is read, MSB page 1 (201) may receive the most read disturb noise. Similarly, if MSB page 1 (201) is read, MSB page 0 (200) and MSB page 2 (202) may receive the worst read disturb noise. (The directly adjacent pages of the page being read are the most affected and thus in embodiments described herein they are the ones tested and corrected, if needed. Naturally, in some embodiments, pages that are not directly adjacent are tested and/or corrected, if needed.

Figure 4:
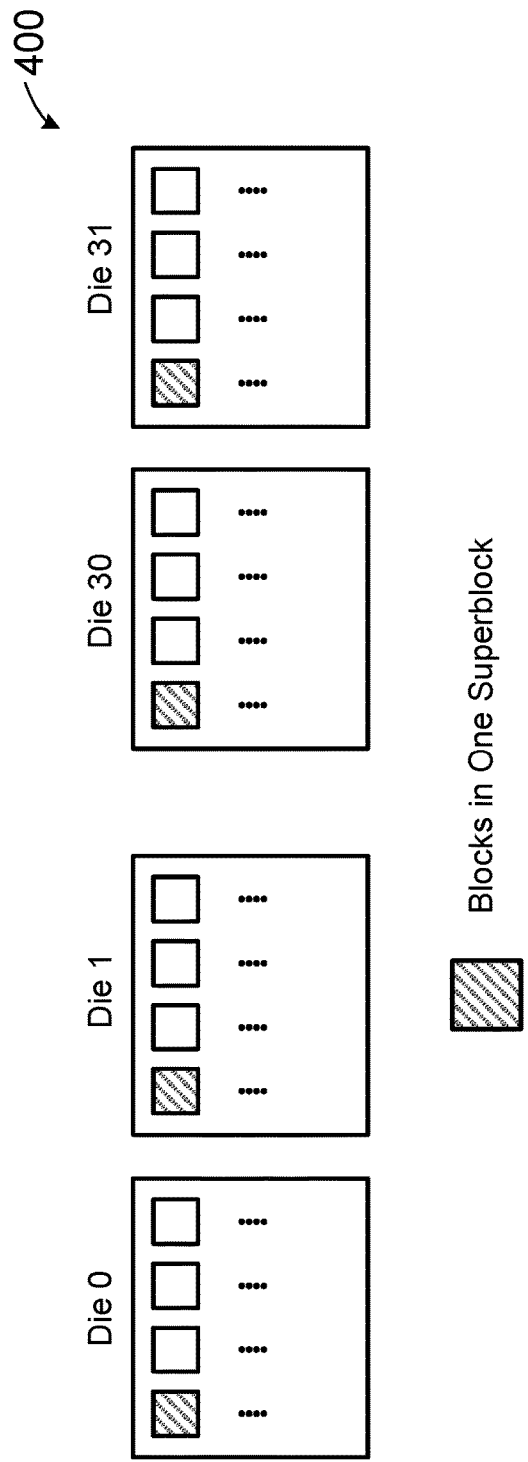
FIG. 4 illustrates examples of blocks in a group for which a single read counter can be used according to some embodiments of the present invention.
Figure 4:
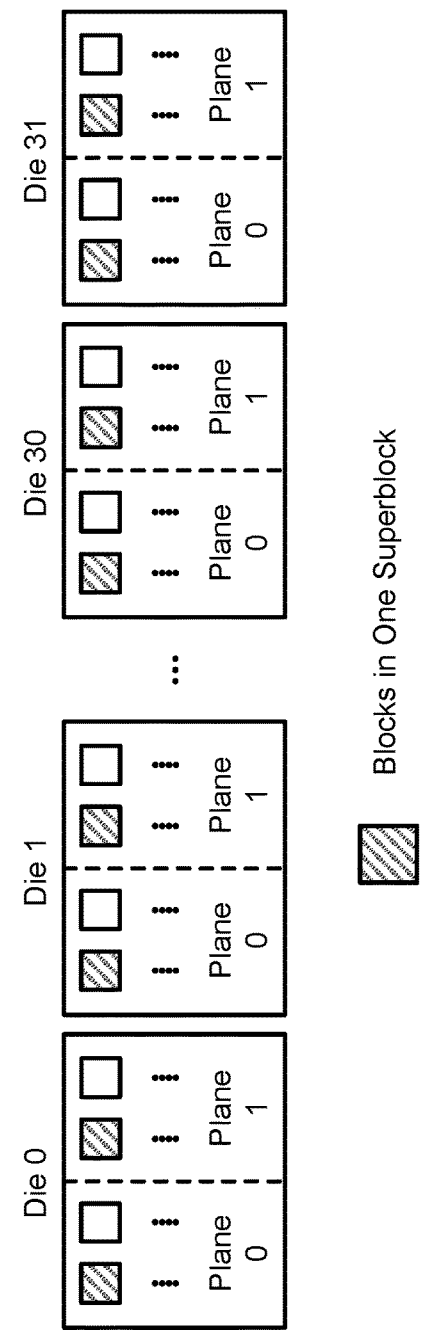

FIG. 4 illustrates examples of blocks in a group for which a single read counter can be used according to some embodiments of the present invention. The upper diagram in FIG. 4 shows an example of blocks in a superblock where the die are single-plane die. In some systems, blocks from different dies are able to be read simultaneously (i.e., in parallel). This can be desirable since it improves the overall throughput of the storage system. Such a group of blocks is sometimes referred to as a superblock, and the grey blocks show blocks in one superblock. In some embodiments, a single read counter can be used to count the number of reads associated with blocks in a superblock.

The lower diagram in FIG. 4 shows an example of blocks in a superblock, in which the dies are dual-plane dies. In a dual-plane die, one block from each plane may be read simultaneously. As such, even though diagrams show the same number of dies (i.e., 32), the number of blocks in the superblock of the upper diagram is 32 compared to 64 in the lower diagram.

Alternatively, a group (i.e., for which a single read counter is used) can include dual plane blocks in a die (e.g., as opposed to a superblock). Further, although a read controller may choose to read all blocks in a given group simultaneously, the read controller is not necessarily required to do so. In some embodiments, a read counter increments by one if all blocks in a given group are read simultaneously. In some embodiments, even if only one block in a given group is read, the read counter can be (also) incremented by one.

Further details of read disturb detection can be found in U.S. Pat. No. 9,570,198, entitled "Read disturb detection," the content of which is incorporated herein by reference in its entirety.

Scaling the NAND flash memory device with a conventional two-dimensional (2D) memory cell array architecture has become more difficult as small geometry photolithography techniques have reached their limits. In addition, issues such as reduction of a sensing margin in accordance with reduction of a number of electrons stored in a data storage element, and disturbances between memory cells, have become barriers against further NAND scaling. To address these issues for downscaling the NAND flash memory devices, various 3-D NAND flash array structures have been suggested.

Figure 5:
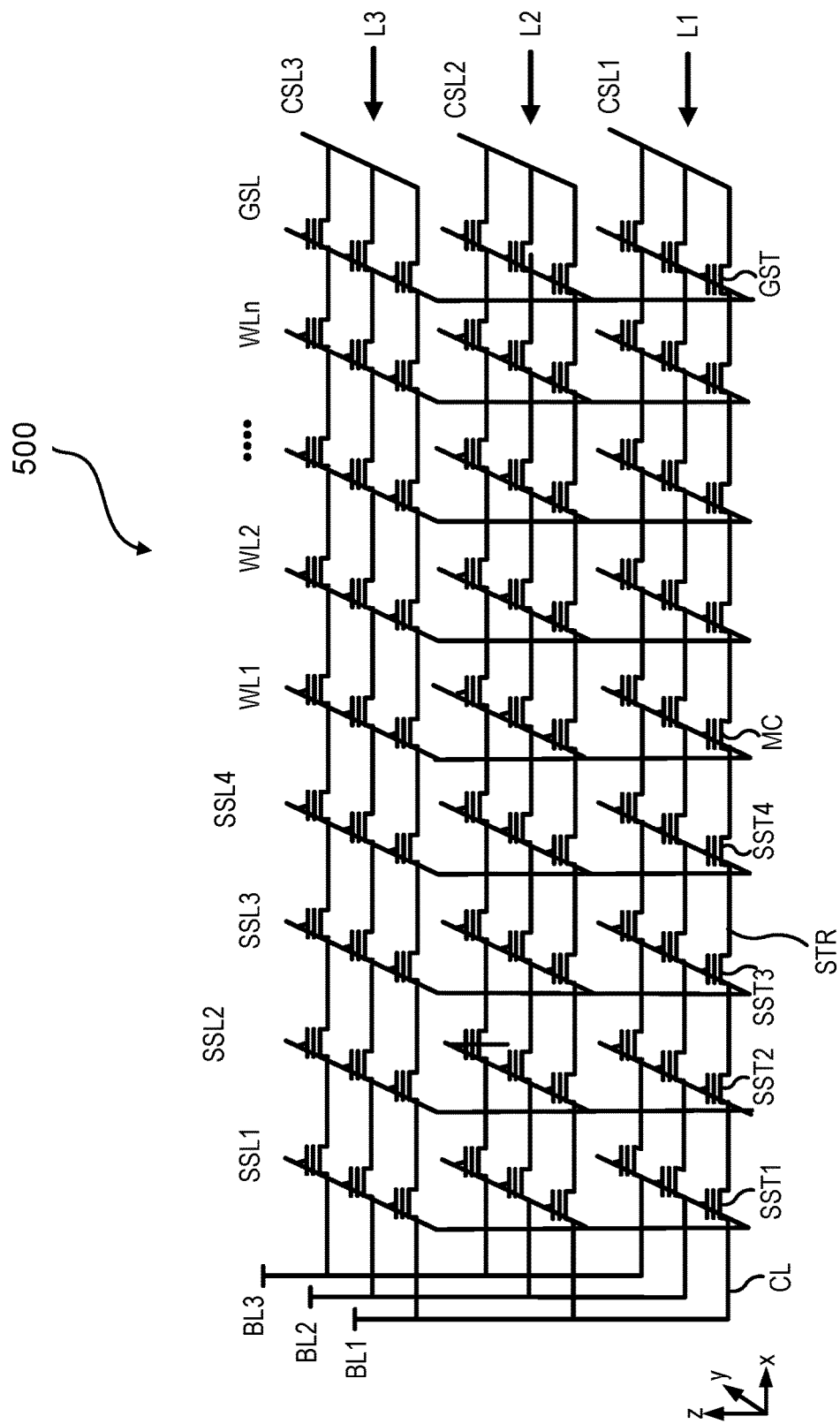
FIG. 5 is a simplified schematic diagram illustrating a 3-D NAND memory array in a 3-D non-volatile memory device according to some embodiments of the present invention.

FIG. 5 is a simplified schematic diagram illustrating a 3-D NAND memory array in a 3-D non-volatile memory device according to some embodiments of the present invention. Memory array 500 includes a plurality of memory cells (MC) arranged in strings (STR) in a plurality of memory layers (in this example, three memory layers, L1, L2, and L3). Each of the memory layers includes a plurality of channel lines (CL) respectively coupled to a plurality of bitlines (BLs) via first ends of the plurality of channel lines (CL) and coupled to a common source line (CSLs) via second ends of the plurality of channel lines (CL). Memory array 500 also includes a plurality of string selection lines (SSL1-SSL4) coupled to string select transistors (SST1-SST3). Further, each of the memory layers also has a plurality of word lines (WL1 to WLn), and a ground selection line (GSL). The plurality of string selection lines (SSLs), the plurality of word lines (WLs), and the ground selection line (GSLs) intersect with the plurality of channel lines. Each of the plurality of channel lines defines a memory string (STR), and the memory string has string selection transistors (SSTs) respectively coupled with the plurality of string selection lines (SSLs). The common ground line GSL may be grounded to turn off common ground transistors GST.

The word lines WL1 to WLn may be connected to control gates of memory cells arranged in a column-wise direction, respectively. The bit lines BL1 to BL3 may be connected to the first ends of the string selection transistors, respectively. A plurality of memory cells having control gate electrodes coupled with the respective word lines WL1 to WLn, in a row-wise direction may constitute a logical page, where a number of logical pages may be determined by a storage capacity of the memory cells.

Further details of 3-D non-volatile memories can be found in U.S. Pat. No. 9,754,673, entitled "Method of initializing and driving 3D non-volatile memory device using time varying erase signal," the content of which is incorporated herein by reference in its entirety.

Figure 6:
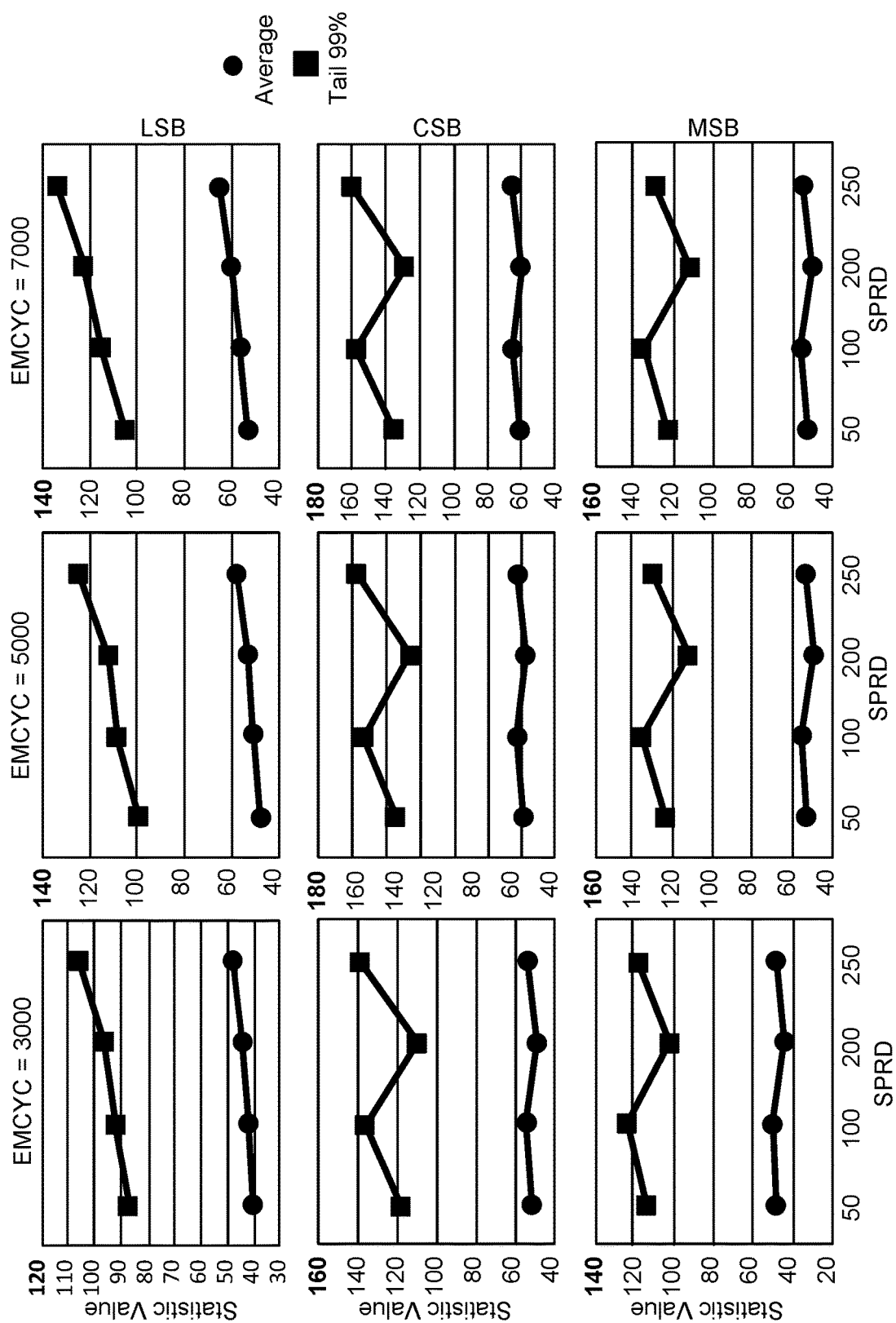
FIG. 6 are diagrams illustrating errors in single page read (SPRD) test in a 3-D NAND memory according to some embodiments of the present invention.

FIG. 6 are diagrams illustrating errors in single page read (SPRD) test in a 3-D NAND memory according to some embodiments of the present invention. The horizontal axis is the number of single page read (SPRD), and the vertical axis is the number of errors. The data points marked by solid circles indicate average number of errors, and the data points marked by solid squares indicate the 99 percentile number of errors. The top row of three plots the number of errors for the least significant bits (LSB), the middle row of three plots the number of errors for the center significant bits (CSB), and the top bottom of three plots the number of errors for the most significant bits (MSB). It can be seen that the center significant bits (CSB) have the most errors.

In some embodiments of the present invention, a method is provided for detecting read disturb that can minimize the amount of counter storage and exploit the 3-D NAND characterization results for detecting the read disturb judiciously for better garbage collection of a superblock.

In mobile products, there is a strict memory requirement for counter storage. Thus, counter length (L bits) is chosen such that frequency of read disturb check is reasonable with minimum storage (e.g., 2 bytes per counter). Another advantage of using smaller counter length is that it renders unnecessary to store the counters in the NAND in case of sudden power off because frequency of read disturb check is adequate for early detection of garbage collection. Further reduction of counters storage can be done if a counter is assigned for particular number of blocks (Nb), it is ensured that all blocks for a counter come from the same superblock as it will help in garbage collection process.

FIG. 7 is a table listing the counter storage required for different values of number of blocks per counter according to some embodiments of the present invention. In this example, a drive of 8 GB capacity has only one die with two blocks in a superblock. The die has total 2048 blocks. If a counter is assigned for two blocks and the counter length is 2 bytes, the storage required for the counter is total blocks/Nb*2 byte=2048/2*2 byte=2 KB. The value of Nb can be increased to decrease the required amount of counter storage, but it comes at a cost of more check reads and more frequent garbage collections. Thus, the optimal value of Nb should be chosen judiciously. We have provided all memory calculation in FIG. 7 so that the value of Nb can be chosen from the allowed counter storage accordingly. Each die has 8 GB capacity and number of dies used can be calculated based on the drive capacity.

In some embodiments of read disturb detection methods, consideration for the following properties of NAND memory is included.

1. Read disturb CSB effect—It is observed from the NAND data that CSB of a page is worst affected by SPRD (See FIG. 1).

2. Neighbor word line effect—Neighboring word lines to victim word line of SPRD are most affected.

3. 3-D NAND BER distribution across word lines—It is also observed that top and bottom word lines have worse BER across all word lines in a block. In this disclosure, we are using top and bottom WLs for test reads however depending upon BER distribution corresponding worst word lines can be picked.

Figure 8:
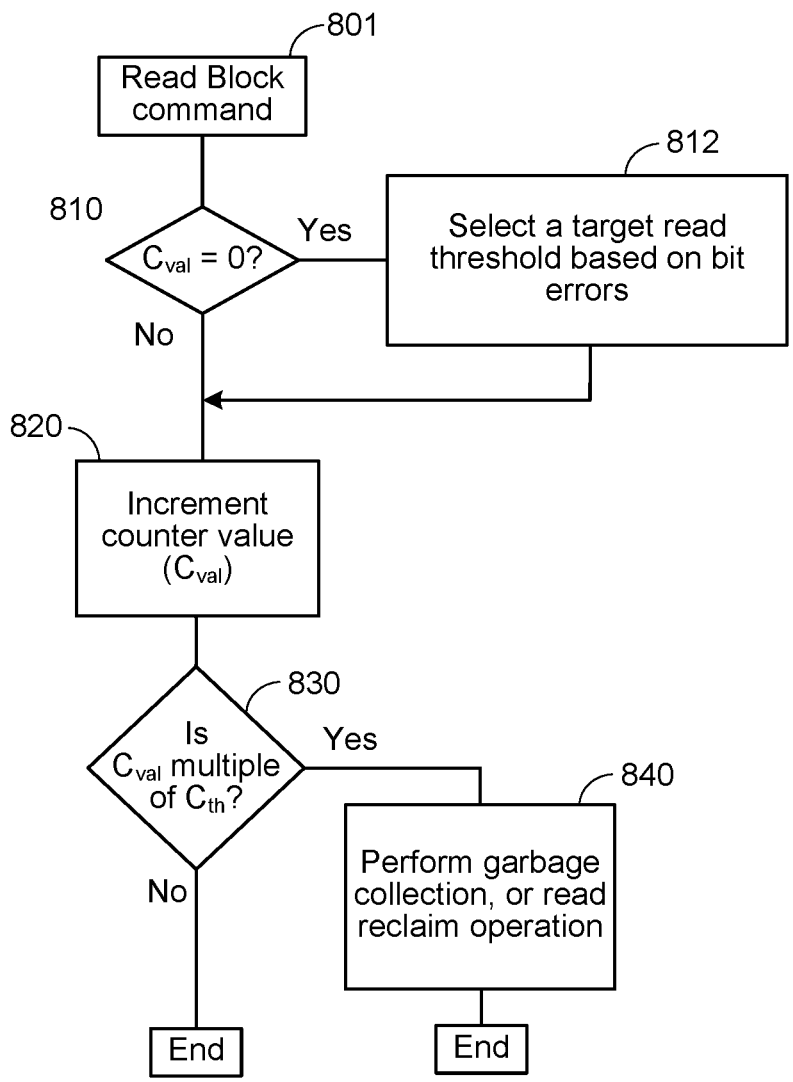
FIG. 8 is a flowchart illustrating a method for controlling a storage system according to some embodiments of the present invention.

FIG. 8 is a flowchart illustrating a method for controlling a storage system according to some embodiments of the present invention. The storage system can include a plurality of memory cells arranged in blocks and a memory controller coupled to the plurality of memory cells for controlling data write and read in the plurality of memory cells. An example of the system is described below with reference to FIG. 10. As shown in FIG. 8, method 800 can include receiving a read command to read a first block (801). The first block is associated with a first read count and a first read threshold. The first read count represents a number of read operations of the first block that has been performed, and the first read threshold represents a number of read operations that triggers a read test operation. At 810, the method can include determining whether the first read count (Cval) is equal to zero. In response to determining that the first read count is equal to zero, selecting a second read threshold as a target read threshold based on bit errors associated with the first block (812). The method can also include, in response to determining that the first read count is not equal to zero, selecting the first read threshold as the target read threshold. The method can also include, at 820, performing a read operation and incrementing the first read count. Further, at 830, the method can include determining whether the first read count is equal to a multiple of the target read threshold. At 840, in response to determining that the first read count is equal to a multiple of the target read threshold, performing a garbage collection, or read reclaim operation, based on comparing the first read count with the target read threshold.

Figure 9:
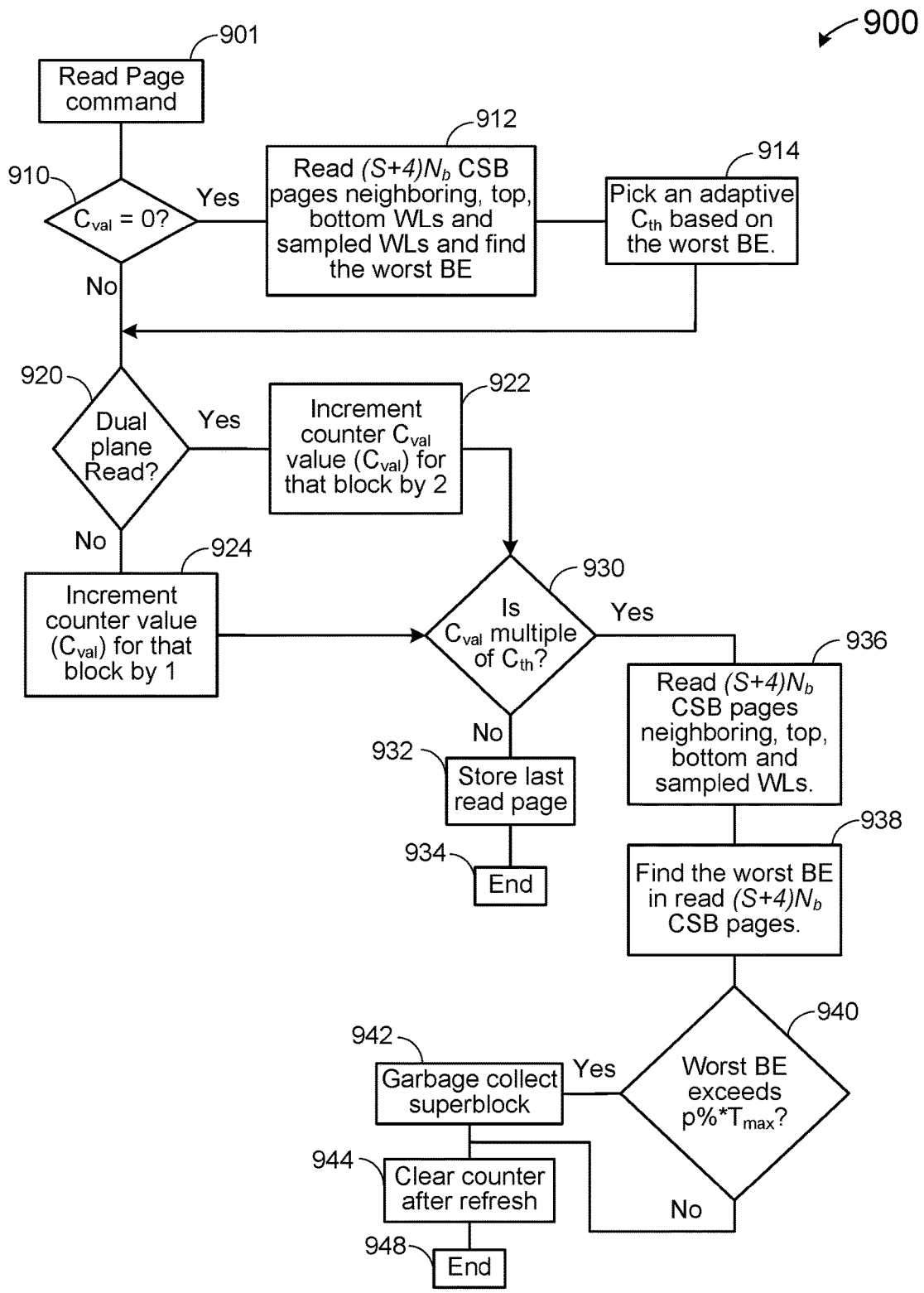
FIG. 9 is a flowchart illustrating another method for a method of controlling a storage system according to some embodiments of the present invention.

FIG. 9 is a flowchart illustrating another method for a method of controlling a storage system according to some embodiments of the present invention. The storage system can include a plurality of memory cells arranged in blocks and a memory controller coupled to the plurality of memory cells for controlling data write and read in the plurality of memory cells. An example of the system is described below with reference to FIG. 10. The memory cells can be NAND memory cells. The method controller can be configured to implement a method 900 illustrated in FIG. 9. As shown in FIG. 9, method 900 can include receiving a read command to read a first block (901). For example, the first block can be a page. In some embodiments, a page can include 4 K bytes of memory cells. The first block can be associated with a first read count and a first read threshold. The first read count represents a number of read operations of the first block that has been performed, and the first read threshold represents a number of read operations that triggers a read test operation.

The memory controller can be configured to set the first read threshold as a target read threshold and determine whether the first read count (Cval) is equal to zero (910). The first read count can be set to zero when a read counter that holds the first read count is refreshed, e.g., after a read reclaim operation. Alternatively, the first read count can be set to zero in a power off condition. In response to determining that the first read count is equal to zero, a second read threshold can be selected as the target read threshold.

The memory controller can be configured to select the second read threshold by performing a test read to determine a number of bit errors associated with a plurality of blocks associated with the first block (912). At 914, the memory controller can select a second read threshold based on the number of bit errors, and setting the second read threshold as the target read threshold (Cth). If the first read count is equal to zero (910), the first read threshold is used as the target read threshold.

In the read disturb algorithm described herein, an adaptive read threshold value (Cth) and read check frequency can be determined if read counters are refreshed to 0. For example, an aggressive frequency of read checks and lower value of (Cth) are selected, if the number of errors in read check crosses a certain threshold and higher values are chosen leading to fewer read checks in a vice versa scenario. For example, the number of errors in the worst CSB pages in read check can be used to compare with certain thresholds. These thresholds can be adaptive based on the condition of blocks after counter refresh in case of garbage collection or read reclaim operation and sudden power off.

In some embodiments, an aggressive threshold can be selected in the case of frequent power off switching, where the read disturb on the victim block can be easily detected. In a regular single plane and dual plane read operations, the counter value is incremented by 1 and 2, respectively. Let PR denote the last read page physical index. The last read page PR is stored, if the counter doesn't exceed a threshold value (Cth). A read check is performed when the counter value reaches a multiple of a threshold value (Cth). After the read check, the counter is reset.

In some embodiments, a plurality of blocks or pages, in addition to the target first block, can be read in a read check and can vary depending on the embodiment. The plurality of blocks is also referred to as an expanded block. For example, in a read check of a 3-D TLC NAND memory, 4*Nb CSB pages across Nb blocks located at top word line, bottom word line, (PR+1)th word line and (PR−1)th word line can be read during a read check. In addition to these reads, additional reads can also be carried out on a block which are distributed uniformly across the block to catch corned cases in test reads. The number of additional reads can be selected depending on a sampling factor S. An example of the additional blocks is described above in connection with FIG. 3. In this case, $(S+4)*N_b$ CSB pages can be used in a read check or test read operation.

In some embodiments, the number of errors in the worst block in a read check can be used to select an adaptive second read threshold to be used as the target threshold. When the read count of the block reaches a multiple of the target read threshold, the block is a candidate for a read reclaim check. In some embodiments, the adaptive second thresholds can be obtained in a lookup table, and selected based on the number of bit errors. For example, the second threshold can be 5 K, 10 K, 25 K, or 50 K, etc. For a block having a high number of bit errors, a low read threshold, such as 5 K reads or 10 K reads, can be used. In the case of a 5 K read threshold, the read count is incremented with every read operation, and a read check test can be performed at 5 K reads, 10 K reads, and 15 K reads, etc. For a block having a low number of bit errors, a high read threshold, such as 25 K reads or 50 K reads, can be used. In the case of a 25 K read threshold, the read count is incremented with every read operation, and a read check test can be performed at 25 K reads, 50 K reads, and 75 K reads, etc.

The memory controller can also be configured to perform a read operation of the first block and increment the first read count. At 920, it is determined if the read operation is a dual plane read or a single plane read. For a single plane read, the first read count is incremented by 1 (924), and for a dual plane read, the first read count is incremented by 2 (922). For a single plane read, the first read count is incremented by 1.

At 930, the memory controller can be configured to determine whether the first read count is a multiple of the target read threshold. At 932, upon determining that the first read count is not a multiple of the target read threshold, the last read page is stored, and the read operation is finished (934). At this point, the system is ready for the next command.

At 936, in response to determining that the first read count is a multiple of the target threshold, the memory controller can be configured to perform a test read operation to determine a number of bit errors associated with the plurality of blocks associated with the first block. At 938, the block (or page) with the worst bit errors is identified. This worst bit error count can be used in determining whether to perform a garbage collection operation.

At 940, the memory controller can also be configured to determine whether the number of bit errors exceeds an error threshold, which can be selected based on the number of bit errors. In some embodiments, the worst bit errors (BE) in these (S+4)*Nb CSB pages is compared with an error threshold, represented by p % of a maximum ECC (error correcting code) correctable errors Tmax*p %, where the percentage p % can be selected based on the number of bit errors. Alternatively, the percentage p % can be selected based on the target read threshold, which can be selected based on the number of bit errors. For example, for BCH error correcting code, the error capability Tmax for a 4 K byte page can be, for example, 200 to 400. For a block having a high number of bit errors, a low percentage p, such as 70%, can be used. For a block having a low number of bit errors, a high percentage p, such as 90%, can be used.

If the number of bit errors exceeds the Tmax*p % when reading at the default threshold, the entire superblock is garbage collected. The value of p can be chosen heuristically, considering the fact that lower value of p will trigger garbage collection more often, and higher value of p can lead to a case where errors may not be detected earlier for garbage collection. The counter is refreshed once it crosses the threshold value.

One advantage of this method is that, on a sudden power off, there is no need to store counters in the NAND flash storage. In this case, the frequency of read checks and the value of p are selected in such a way that a garbage collection or a read reclaim operation is triggered beforehand handling any corner cases.

At 942, in response to determining that the number of bit errors exceeds the error threshold, the memory controller can be configured to perform a read reclaim operation in the plurality of blocks associated with the first block.

At 944, after the read reclaim operation, the first read count associated with the first block is cleared, e.g., set to 0. At this point, the read operation is finished (948).

Figure 10:
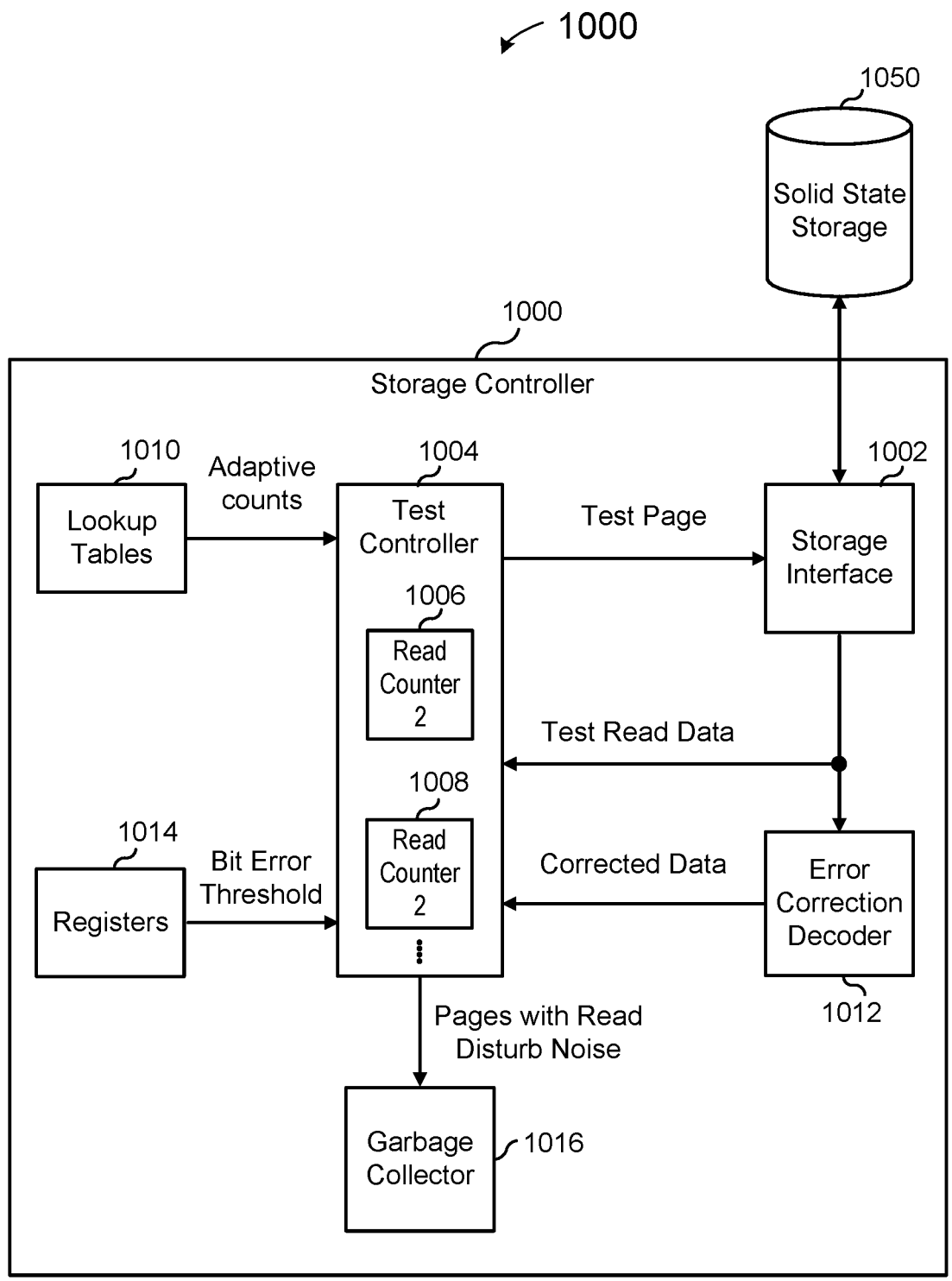
FIG. 10 is a diagram illustrating a solid state storage system according to some embodiments of the present invention.

FIG. 10 is a diagram illustrating a solid state storage system according to some embodiments of the present invention. Storage controller, also referred to as memory controller, 1000 is one example of a system which performs the techniques described herein. In some embodiments, storage controller 1000 can be implemented on a semiconductor device, such as an ASIC or FPGA.

Test controller 1004 includes a plurality of read counters, including read counters 1006 and 1008. Each read counter in this example is associated with a different group of blocks for which reads to those groups of blocks is being tracked. For example, the first read counter (1006) counts reads to a first group of blocks on solid state storage 1050, and the second read counter (1008) counts reads to a second group of blocks on solid state storage 1050. For simplicity, solid state storage 1050 is shown in this figure as a single device or component, but in some embodiments it may include multiple devices or multiple components.

Storage controller 1000 can include lookup tables 1010, which can provide adaptive read threshold counts and adaptive error threshold counts. A target read threshold and an error threshold, as described above, can be selected from lookup tables 1010 based on the number of bit errors.

The test read data for the initial test page and/or the adjacent page are passed from storage interface 1002 to error correction decoder 1012 and test controller 1004. Error correction decoder 1012 (e.g., an LDPC decoder or a BCH decoder) performs error correction decoding on the test read data and sends the corrected data (assuming the test read data is able to be corrected, in other words, within the error correcting capability of the system) to test controller 1004. Test controller 1004 uses the (uncorrected) test read data from storage interface 1002 and the corrected data from error correction decoder 1012 to determine a number of bit errors. If the number of bit errors reaches a multiple of a bit error threshold, also referred to as a read threshold, which can be obtained, for example, from registers 1014, which are programmable), then the test controller flags the tested page (e.g., the initial test page or the adjacent page) as a candidate for a read reclaim operation.

Test controller 1004 identifies the pages with read disturb noise to garbage collector 1016, which performs corrective processing on those pages (e.g., by copying the data, with or without error correction decoding, to a new location). If some other corrective processes are performed (e.g., in addition to or as an alternative to garbage collection), then test controller 1004 would identify the pages with read disturb noise to those components.

Figure 11:
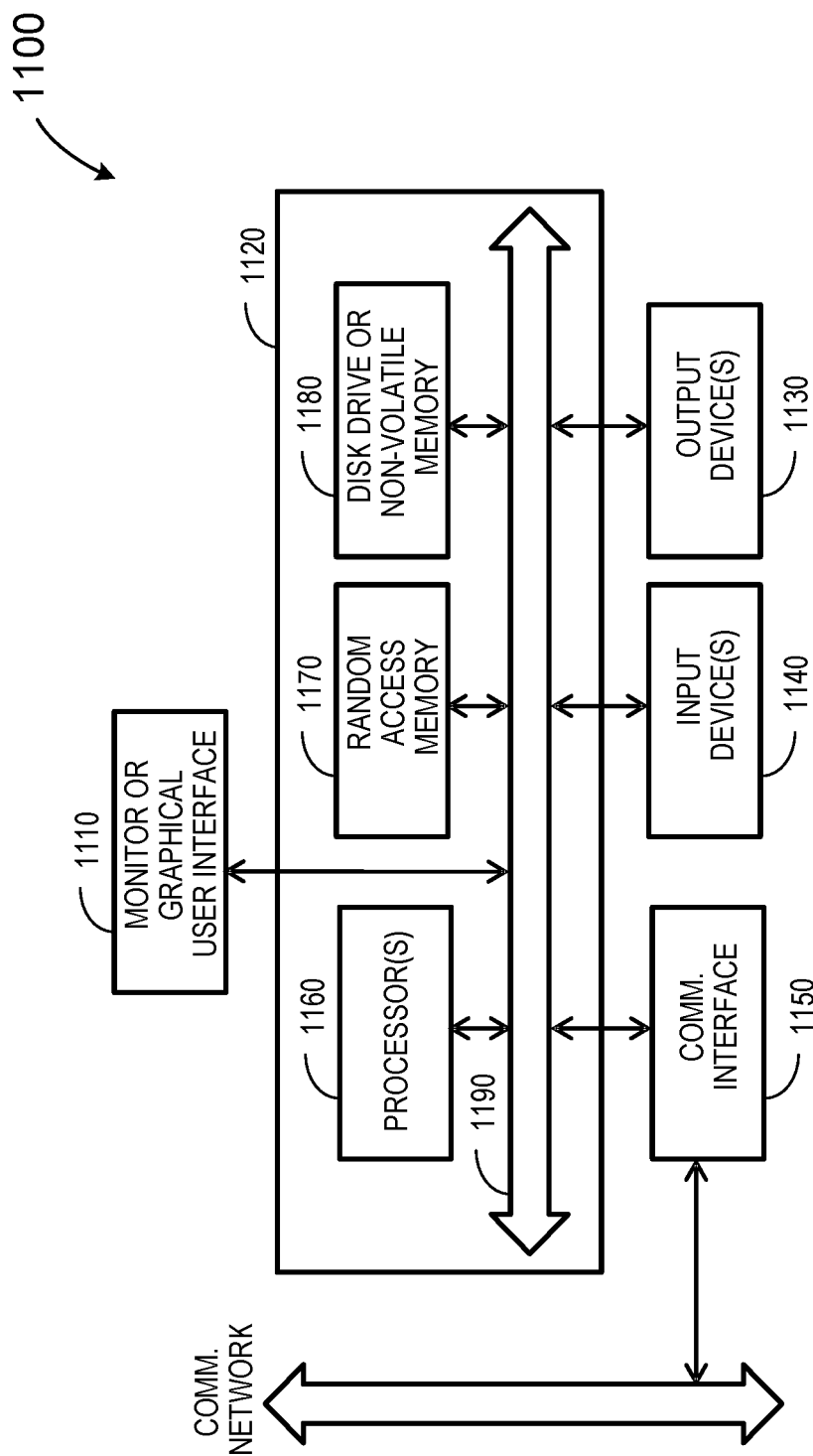
FIG. 11 is a simplified block diagram illustrating an apparatus that may be used to implement various embodiments according the present invention.

FIG. 11 is a simplified block diagram illustrating an apparatus that may be used to implement various embodiments according the present invention. FIG. 11 is merely illustrative of an embodiment incorporating the present disclosure and does not limit the scope of the disclosure as recited in the claims. One of ordinary skill in the art would recognize other variations, modifications, and alternatives. In one embodiment, computer system 1100 typically includes a monitor 1110, a computer 1120, user output devices 1130, user input devices 1140, communications interface 1150, and the like.

As shown in FIG. 11, computer 1120 may include a processor(s) 1160 that communicates with a number of peripheral devices via a bus subsystem 1190. These peripheral devices may include user output devices 1130, user input devices 1140, communications interface 1150, and a storage subsystem, such as random access memory (RAM) 1170 and disk drive 1180.

User input devices 1140 can include all possible types of devices and mechanisms for inputting information to computer system 1120. These may include a keyboard, a keypad, a touch screen incorporated into the display, audio input devices such as voice recognition systems, microphones, and other types of input devices. In various embodiments, user input devices 1140 are typically embodied as a computer mouse, a trackball, a track pad, a joystick, wireless remote, drawing tablet, voice command system, eye tracking system, and the like. User input devices 1140 typically allow a user to select objects, icons, text and the like that appear on the monitor 1110 via a command such as a click of a button or the like.

User output devices 1130 include all possible types of devices and mechanisms for outputting information from computer 1120. These may include a display (e.g., monitor 1110), non-visual displays such as audio output devices, etc.

Communications interface 1150 provides an interface to other communication networks and devices. Communications interface 1150 may serve as an interface for receiving data from and transmitting data to other systems. Embodiments of communications interface 1150 typically include an Ethernet card, a modem (telephone, satellite, cable, ISDN), (asynchronous) digital subscriber line (DSL) unit, FireWire interface, USB interface, and the like. For example, communications interface 1150 may be coupled to a computer network, to a FireWire bus, or the like. In other embodiments, communications interfaces 1150 may be physically integrated on the motherboard of computer 1120, and may be a software program, such as soft DSL, or the like.

In various embodiments, computer system 1100 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, computer 1120 includes one or more Xeon microprocessors from Intel as processor(s) 1160. Further, in one embodiment, computer 1120 includes a UNIX-based operating system.

RAM 1170 and disk drive 1180 are examples of tangible storage media configured to store data such as embodiments of the present disclosure, including executable computer code, human readable code, or the like. Other types of tangible storage media include floppy disks, removable hard disks, optical storage media such as CD-ROMS, DVDs and bar codes, semiconductor memories such as flash memories, read-only memories (ROMS), battery-backed volatile memories, networked storage devices, and the like. RAM 1170 and disk drive 1180 may be configured to store the basic programming and data constructs that provide the functionality of the present disclosure.

Software code modules and instructions that provide the functionality of the present disclosure may be stored in RAM 1170 and disk drive 1180. These software modules may be executed by processor(s) 1160. RAM 1170 and disk drive 1180 may also provide a repository for storing data used in accordance with the present disclosure.

RAM 1170 and disk drive 1180 may include a number of memories including a main random access memory (RAM) for storage of instructions and data during program execution and a read-only memory (ROM) in which fixed non-transitory instructions are stored. RAM 1170 and disk drive 1180 may include a file storage subsystem providing persistent (non-volatile) storage for program and data files. RAM 1170 and disk drive 1180 may also include removable storage systems, such as removable flash memory.

Bus subsystem 1190 provides a mechanism for letting the various components and subsystems of computer 1120 communicate with each other as intended. Although bus subsystem 1190 is shown schematically as a single bus, alternative embodiments of the bus subsystem may utilize multiple busses.

FIG. 11 is representative of a computer system capable of embodying the present disclosure. It will be readily apparent to one of ordinary skill in the art that many other hardware and software configurations are suitable for use with the present disclosure. For example, the computer may be a desktop, portable, rack-mounted or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc.; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer-readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A non-volatile data storage device, comprising:
    a plurality of memory cells arranged in blocks; and
    a memory controller coupled to the plurality of memory cells for controlling data write and read in the plurality of memory cells;
    wherein the memory controller is configured to:
        receive a read command to read a first block, the first block being associated with a first read count and a first read threshold, wherein the first read count represents a number of read operations of the first block that has been performed, and the first read threshold represents a number of read operations that triggers a read test operation;
        set the first read threshold as a target read threshold;
        determine whether the first read count is equal to zero;
        in response to determining that the first read count is equal to zero, select a second read threshold as the target read threshold, wherein selecting the second read threshold includes:

performing a test read to determine a number of bit errors associated with a plurality of blocks associated with the first block;
selecting the second read threshold based on the number of bit errors; and
setting the second read threshold as the target read threshold;
perform a read operation of the first block;
increment the first read count;
determine whether the first read count exceed the target read threshold;
in response to determining that the first read count is equal to a multiple of the target read threshold:
perform a test read operation to determine a number of bit errors associated with the plurality of blocks associated with the first block;
determine whether the number of bit errors exceeds an error threshold, the error threshold being selected based on the number of bit errors;
in response to determining that the number of bit errors exceeds the error threshold:
perform a read reclaim operation in the plurality of blocks associated with the first block; and
clear the first read count associated with the first block.

2. The device of claim 1, wherein the read reclaim operation comprises copying valid values from the plurality of the memory cells to another plurality of memory cells.

3. The device of claim 1, wherein the error threshold is a percentage of an error correction capability of the device, the percentage being selected based on the number of bit errors.

4. The device of claim 1, wherein the error threshold is a percentage of an error correction capability of the device, the percentage being selected based on the target read threshold.

5. The device of claim 1, wherein performing a test read to determine a number of bit errors comprises: performing a read operation of an expanded block associated with the first block; perform error correction decoding to determine a number of bit errors in each block in the expanded block; and determine a highest number of bit errors among the blocks in the expanded block.

6. The device of claim 5, wherein the expanded block comprises neighboring blocks most affected by reading the first block.

7. The device of claim 6, wherein the expanded block further comprises, in a 3-D NAND storage system, pages associated with a word line at a higher level than the first block and pages associated with a word line at a lower level than the first block.

8. The device of claim 1, wherein the first read count is set to 0 after a power off.

9. The device of claim 1, wherein the memory controller is configured to select the second read threshold from a lookup table based on the number of bit errors.

10. The device of claim 9, wherein the lookup table comprises decreasing second read thresholds for increasing number of bit errors.

11. A system, comprising:
a plurality of memory cells arranged in blocks; and
a memory controller coupled to the plurality of memory cells for controlling data write and read in the plurality of memory cells;
wherein the memory controller is configured to:
receive a read command to read a first block, the first block being associated with a first read count and a first read threshold, wherein the first read count represents a number of read operations of the first block that has been performed, and the first read threshold represents a number of read operations that triggers a read test operation;
determine whether the first read count is equal to zero;
in response to determining that the first read count is equal to zero, select a second read threshold as a target read threshold based on bit errors associated with the first block;
in response to determining that the first read count is not equal to zero, select the first read threshold as the target read threshold;
perform a read operation;
increment the first read count;
determine whether the first read count is equal to a multiple of the target read threshold;
in response to determining that the first read count exceeds the target read threshold, perform a read reclaim operation based on comparing the first read count with the target read threshold.

12. The system of claim 11, wherein selecting the second read threshold comprises: performing a test read to determine a number of bit errors associated with a plurality of blocks associated with the first block; and selecting the second read threshold based on the number of bit errors.

13. The system of claim 11, wherein the memory controller is configured to: perform a test read operation to determine a number of bit errors associated with a plurality of blocks associated with the first block;
determine whether the number of bit errors exceeds an error threshold, the error threshold being selected based on the number of bit errors;
in response to determining that the number of bit errors exceeds the error threshold:
perform a read reclaim operation in the plurality of blocks associated with the first block; and
clear the first read count associated with the first block.

14. The system of claim 13, wherein the error threshold is a percentage of an error correction capability of the system, the percentage being selected based on the number of bit errors.

15. The system of claim 11, wherein the read reclaim operation comprises copying valid values from the plurality of the memory cells to another plurality of memory cells.

16. A method of controlling a storage system, the storage system including a plurality of memory cells arranged in blocks and a memory controller coupled to the plurality of memory cells for controlling data write and read in the plurality of memory cells, the method comprising:
receiving a read command to read a first block, the first block being associated with a first read count and a first read threshold, wherein the first read count represents a number of read operations of the first block that has been performed, and the first read threshold represents a number of read operations that triggers a read test operation;
determining whether the first read count is equal to zero;
in response to determining that the first read count is equal to zero, selecting a second read threshold as a target read threshold based on bit errors associated with the first block;
in response to determining that the first read count is not equal to zero, selecting the first read threshold as the target read threshold;
performing a read operation;
incrementing the first read count;
determining whether the first read count is equal to a multiple of the target read threshold;

in response to determining that the first read count exceeds the target read threshold, performing a read reclaim operation based on comparing the first read count with the target read threshold.

17. The method of claim 16, wherein selecting the second read threshold comprises: performing a test read to determine a number of bit errors associated with a plurality of blocks associated with the first block; and selecting the second read threshold based on the number of bit errors.

18. The method of claim 16, further comprising:
performing a test read operation to determine a number of bit errors associated with a plurality of blocks associated with the first block;
determining whether the number of bit errors exceeds an error threshold, the error threshold being selected based on the number of bit errors;
in response to determining that the number of bit errors exceeds the error threshold:
performing a read reclaim operation in the plurality of blocks associated with the first block; and
clearing the first read count associated with the first block.

19. The method of claim 18, wherein the error threshold is a percentage of an error correction capability of the storage system, the percentage being selected based on the number of bit errors.

20. The method of claim 16, wherein the read reclaim operation comprises copying valid values from the plurality of the memory cells to another plurality of memory cells.

* * * * *